United States Patent

Hurst et al.

Patent Number: 5,939,772
Date of Patent: Aug. 17, 1999

[54] SHIELDED PACKAGE FOR MAGNETIC DEVICES

[75] Inventors: Allan T. Hurst, Anoka; Richard K. Spielberger, Maple Grove, both of Minn.

[73] Assignee: Honeywell Inc., Minneapolis, Minn.

[21] Appl. No.: 08/962,512

[22] Filed: Oct. 31, 1997

[51] Int. Cl.⁶ .......................... H01L 23/02; H01L 23/522
[52] U.S. Cl. .......................... 257/659; 257/704; 257/710; 257/659; 257/660; 257/729; 257/921
[58] Field of Search .................................. 257/704, 710, 257/659, 660, 729, 921

[56] References Cited

U.S. PATENT DOCUMENTS

| | | |
|---|---|---|
| 4,839,716 | 6/1989 | Butt .......................................... 257/704 |
| 4,953,002 | 8/1990 | Nelson et al. . |
| 5,559,306 | 9/1996 | Mahulikar ................................ 257/659 |
| 5,635,754 | 6/1997 | Strobel et al. ........................... 257/660 |
| 5,650,659 | 7/1997 | Mostafazadeh et al. ................ 257/660 |

*Primary Examiner*—Peter Toby Brown
*Assistant Examiner*—Hung Van Duong
*Attorney, Agent, or Firm*—Gregory A. Bruns

[57] ABSTRACT

A package for shielding a circuit containing magnetically sensitive materials from external magnetic fields. A shield attached to a base of the package is connected by vias to a first conductive plane. A shield attached to a lid of the package is connected by vias to a second conductive plane. The first shield and the second shield are electrically interconnected. Conductive leads extend from the package and are connected internally to the circuit.

12 Claims, 3 Drawing Sheets

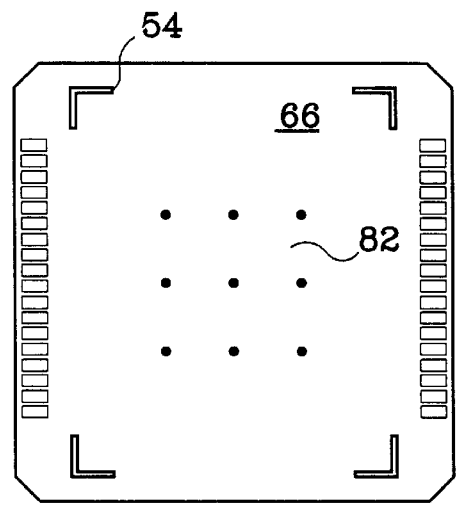
*Fig.3*
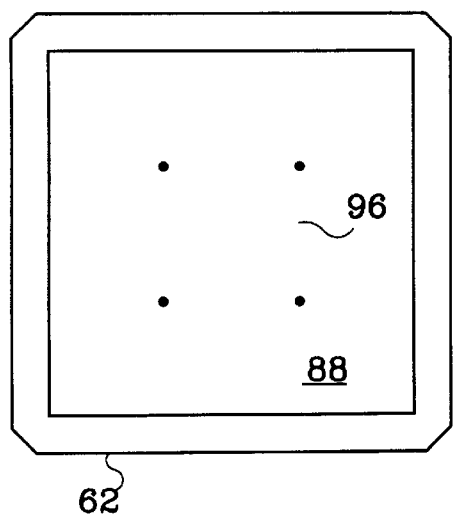 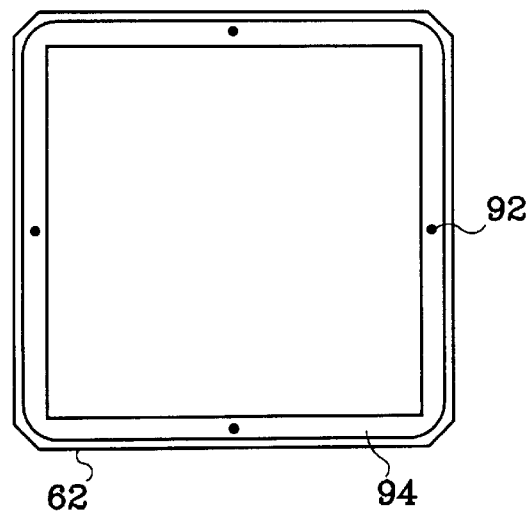
*Fig.4a* *Fig.4b*

SHIELDED PACKAGE FOR MAGNETIC DEVICES

BACKGROUND OF THE INVENTION

The present invention relates to housings for semiconductor devices and, more particularly, to housings for semiconductor devices having magnetic materials used therein which are to be protected from external magnetic fields.

A shield for protection from magnetic fields may be formed of a metal having a relatively high permeability. One such metal which is well known for use in magnetic shielding and has a high-initial permeability is known as Carpenter HiMu "80"® alloy, having approximately 80% nickel, 4.2% molybdenum, 0.5% manganese, 0.35% silicon, 0.02% carbon and the balance of iron. This alloy is available from Carpenter I Technology Corporation, Carpenter Steel Division. Such alloys are referred to generally as Mu metal and are available from other sources.

Early efforts with DIP packages attempted to use a Mu metal shield that would serve as the lid as well as the magnetic shield. Mu metal lids with a gold tin sealing preform attached were solder reflowed for sealing. The temperature coefficient mismatch of the Mu metal and the DIP material caused the packages to crack under the temperature variation required for solder reflow. The use of a Kovar seal ring was simulated to see if the lid could be welded at room temperature. The simulation showed that the Kovar ring would couple a magnetic field into the package and therefore be a detriment.

U.S. Pat. No. 4,953,002 entitled "Semiconductor Device Housing with Magnetic Field Protection" dated Aug. 28, 1990 and assigned to Honeywell Inc. contains information on magnetic shielding and is hereby incorporated by reference.

For military, space or other applications requiring a high reliability package, it is desirable to have a hermetically sealed package that is free from any internal organic materials such as epoxy materials. In applications such as the radiation environment of space, it is also desirable to have the metal parts within the package at $V_{SS}$ or ground potential.

SUMMARY OF THE INVENTION

The present invention solves these and other needs by providing a package for a circuit die containing a magnetically sensitive material includes a base having a surface for receiving the dies and a shield attached to the base opposite the die. A lid for receipt on the package has a cavity for receiving a second shield. A conductive plane located in the base is electrically connected to the shield attached to the base and a conductive plane in the lid is electrically connected to the shield attached to the lid. The two conductive planes are interconnected within the package.

BRIEF DESCRIPTION OF THE DRAWINGS

FIG. 3 is a plan view showing additional details about the package of FIG. 2.

FIGS. 4a and 4b are plan views showing additional details about the package of FIG. 2.

DETAILED DESCRIPTION

Figure 1:
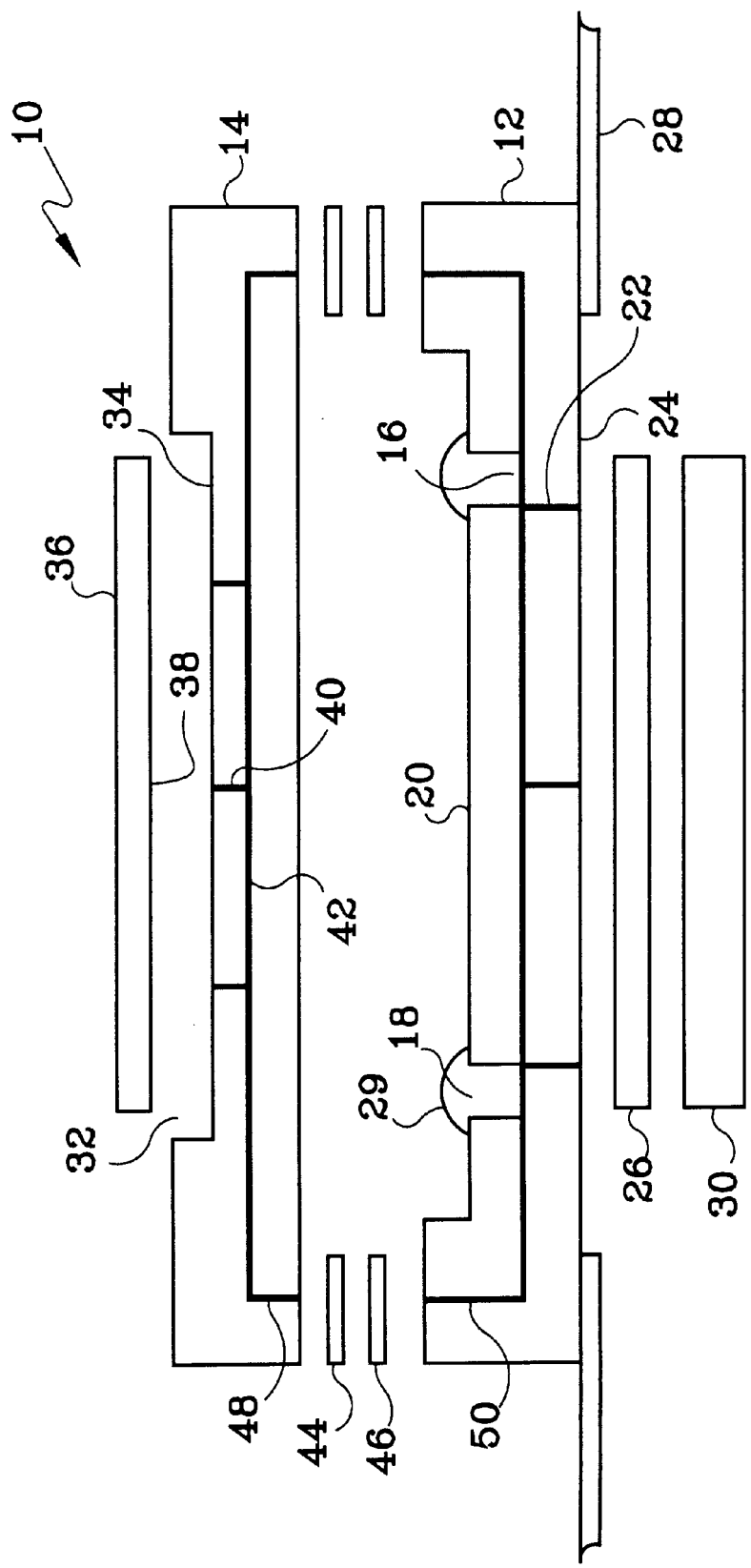
FIG. 1 is an exploded cross-sectional elevation view of a package according to the principles of the present invention.

A housing or package is shown in the drawings and is generally designated 10. With reference to FIG. 1, package 10 includes a base 12 and a lid 14. Base 12 has a cavity 18 having a surface 16 for receiving die 20 with surface 16 being a $V_{SS}$ or ground plane. Vias of which via 22 is representative extend from ground plane 16 to exterior surface 24. A planar magnetic shield 26 is secured to surface 24 with a conductive material, for example, conductive epoxy. Thus planar magnetic shield 26 is electrically connected to ground plane 16 by the conductive material and via 22.

Optional standoff 30 is secured to an opposite surface of planar magnetic shield 26. Standoff 30 provides some stress relief when package 10 is mounted to a printed wiring board.

Lid 14 includes a cavity 32 having a surface 34 for receiving a planar magnetic shield 36 having a surface 38. Vias 40 extend to surface 34 so that when shield 36 is secured to surface 34 using a conductive material, surface 34 will be electrically connected to vias 40. Ground or $V_{SS}$ plane 42 is located in lid 14 and vias 48 connect plane 42 to conductive lid rings 44. In assembly, lid ring 44 contacts seal ring 46. Vias 50 in base 12 connect seal ring 46 to $V_{SS}$ plane 16. Electrically conductive leads 28 extend from either side of base 12 and are internally connected within base 12 to pads which are connected by wire bonds 29 to circuits in die 20.

Figure 2:
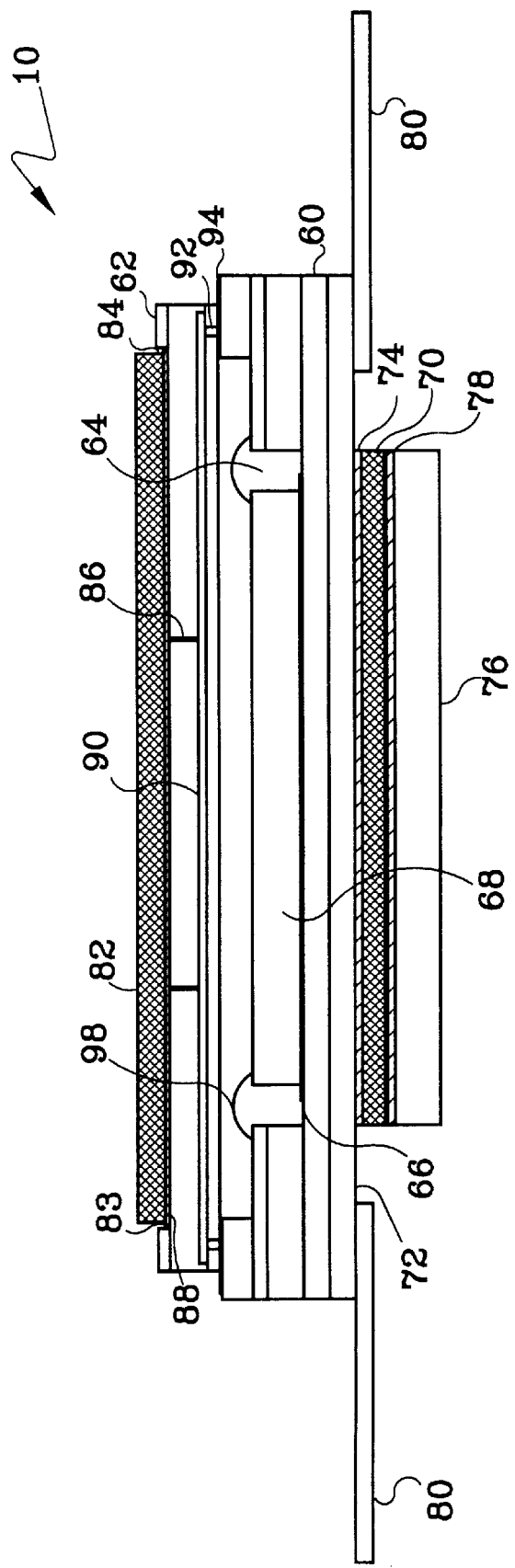
FIG. 2 is a cross-sectional view of a package according to the principles of the present invention.

Additional details of a specific embodiment of housing or package 10 are shown in FIG. 2 which shows a multilayer ceramic package and includes a base 60 and a lid 62. Base 60 has a cavity 64 and a surface 66 for receiving die 68. Base 60 includes a $V_{SS}$ or ground plane at surface 66, a signal layer and a $V_{DD}$ or supply voltage plane. A planar magnetic shield 70 is secured to surface 72 of base 60 with a conductive adhesive 74. Optional standoff 76 is secured to shield 70 by adhesive 78. Leads 80 extend from surface 72 in a direction away from base 60.

The vias that extend to surface 66 are not shown for simplicity in FIG. 2, but this principle is shown in FIG. 1. FIG. 3 (not to scale) shows a plan view of a portion of the bottom of base 60, including a via pattern 66 including, for example, nine vias that extend to surface 66 in cavity 64. Marking 54 shows the location of shield 70.

Lid 62 includes a cavity 84 with vias 86 at surface 88 and extending to $V_{SS}$ plane 90 which extends to an edge of lid 62 where vias 92 extend to contact lid ring 94. Planar magnetic shield 82 is secured by a conductive adhesive 83 to surface 88 and vias 86. FIG. 4a shows a top view (not to scale) of cavity 84 and surface 88, and a via pattern 96 including, for example, four vias that would extend to $V_{SS}$ plane 90. FIG. 4b shows a bottom view (not to scale) of lid 62, lid ring 94 and vias 92.

To maintain a completely inorganic packaging approach, die 68 is backside metallized with nickel gold thin film. Die 68 is then attached to surface 66 with a solder alloy such as 5/95 tin lead.

Interconnects between die 68 and package 10 are wirebonds 98 and are typically ultrasonic aluminum. The final package seal is accomplished with solder sealing through a furnace with 80/20 gold tin eutectic.

Since the materials used in assembly are high temperature, for example, die bond at 320° C. and package seal at 340° C., die 68 can also be annealed and subjected to a magnetic field for magnetic domain orientation at an elevated temperature such as 300–350° C. This would be done before attaching the external Mu metal shields.

The multilayer ceramic package of FIG. 2 offers several advantages. It is desirable for the size of the shield to overlap the size of the die by some amount. Typically the amount of overlap is 2.5 to 3 times the vertical space between the shield and the die. Cavity 84 in lid 62 allows shield 82 to be smaller in size than if the vertical separation of die 68 and shield 82 were greater. A package such as that of FIG. 2 may be made quite thin even though base 60 includes a $V_{SS}$ plane, a signal plane and a $V_{DD}$ plane.

Additional advantages include the following. The present invention locates the shields outside the package to prevent secondary electron effects in a radiation environment. Organic epoxies can be used to attach the shields while maintaining the interior of the package free of organics. The use of a ceramic package material provides a good coefficient of expansion match with the Mu metal shield. A radiation hardened high reliability hermetic package suitable to military missile and space applications is provided by applicant's invention.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

We claim:

1. Package for a circuit die containing magnetically sensitive material, said package shielding said circuit from magnetic fields, comprising:

a base having a surface for receiving said die;

a first shield secured to an external surface of said base opposite said die;

a lid for receipt on said base;

a second shield secured to an external surface of said lid opposite said die;

said first shield and said second shield formed of a material having a relatively high magnetic permeability;

means within said package for making an electrical connection between said first shield and said second shield; and conductive leads extending from said package, said conductive leads selectively connected within said package to said circuit die.

2. Package of claim 1 wherein said means for making an electrical connection comprises:

first via means located in said base;

second via means located in said lid; and conductive means extending between said base and said lid.

3. Package of claim 2 wherein said via means comprises;

a first plurality of vias contacting said first shield, and a second plurality of vias contacting said second shield.

4. Package of claim 1 wherein said die is a magnetoresistive memory device.

5. Package of claim 1 wherein said die is a magnetic sensor.

6. Package of claim 1, further comprising:

a ground plane;

means for connecting said first shield and said second shield to said ground plane within said package.

7. Package for a circuit die containing magnetically sensitive material, said package shielding said circuit from magnetic fields, comprising:

a base having a recessed surface for receiving said die;

a first shield of relatively high magnetic permeability secured to said base opposite said die;

a first conductive plane located in said base;

means for electrically connecting said first shield to said first plane;

a lid;

a second shield of relatively high magnetic permeability secured to said lid opposite said die;

a second conductive plane located in said lid;

means for electrically connecting said second shield to said second plane;

means for electrically connecting said first plane and said second plane; and a plurality of conductive leads extending from said package with selected ones of said plurality of conductive leads connected within said package to said circuit die.

8. Package of claim 7 wherein said means for electrically connecting comprises:

first via means located in said base;

second via means located in said lid; and conductive means extending between said base and said lid.

9. Package of claim 7 wherein said conductive means comprises a lid ring.

10. Package for a circuit die containing magnetically sensitive material, said package shielding said circuit from magnetic fields, comprising:

a base having a conductive surface for receiving said die;

a first shield secured to an external surface of said base opposite said die;

a lid for receipt on said base, said lid having a ground plane within;

a second shield secured to an external surface of said lid opposite said die;

means within said package for electrically interconnecting said conductive surface, said first shield, said ground plane and said second shield; and conductive leads extending from said package, said conductive leads selectively connected within said package to said circuit die.

11. Package of claim 10 wherein said means for making an electrical connection comprises:

first via means located in said base;

second via means located in said lid; and conductive means extending between said base and said lid.

12. Package of claim 11 wherein said base and said lid comprise a ceramic material and said package is hermetic.

* * * * *

UNITED STATES PATENT AND TRADEMARK OFFICE
CERTIFICATE OF CORRECTION

PATENT NO: 5,939,772

DATED: August 17, 1999

INVENTOR(S): Allan T. Hurst, Richard K. Spielberger

It is certified that error appears in the above-identified patent and that said Letters Patent is hereby corrected as shown below:

Column 1, Line 5, before "The present invention" insert the following sentence:

The U.S. Government has certain rights in this invention pursuant to Contract No. DASG60-89-C-0153, awarded by the Department of the Army.

Signed and Sealed this

Sixth Day of June, 2000

Q. TODD DICKINSON

*Attest:*

*Attesting Officer*     *Director of Patents and Trademarks*